US011674990B2

(12) United States Patent
Arai et al.

(10) Patent No.: US 11,674,990 B2
(45) Date of Patent: Jun. 13, 2023

(54) CAPACITIVE VOLTAGE MEASUREMENT DEVICE

(71) Applicant: Nippon Telegraph and Telephone Corporation, Tokyo (JP)

(72) Inventors: Naruto Arai, Tokyo (JP); Ken Okamoto, Tokyo (JP); Jun Kato, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 191 days.

(21) Appl. No.: 17/415,345

(22) PCT Filed: Dec. 26, 2019

(86) PCT No.: PCT/JP2019/051052
§ 371 (c)(1),
(2) Date: Jun. 17, 2021

(87) PCT Pub. No.: WO2020/149135
PCT Pub. Date: Jul. 23, 2020

(65) Prior Publication Data
US 2022/0057442 A1    Feb. 24, 2022

(30) Foreign Application Priority Data
Jan. 15, 2019    (JP) .............................. JP2019-004064

(51) Int. Cl.
*G01R 19/00*    (2006.01)
*G01R 29/08*    (2006.01)
(Continued)

(52) U.S. Cl.
CPC ........... *G01R 29/085* (2013.01); *G01R 15/04* (2013.01); *G01R 15/16* (2013.01)

(58) Field of Classification Search
CPC .. G01R 31/001; G01R 31/52; G01R 19/0084; G01R 19/085; G01R 19/12; G01R 15/04; G01R 15/16
See application file for complete search history.

(56) References Cited

U.S. PATENT DOCUMENTS 5,886,532 A * 3/1999 Hsu .................. G01Q 60/22
977/851
10,802,072 B2 * 10/2020 Steuer ................ G01R 31/302
(Continued)

OTHER PUBLICATIONS

Kobayashi et al., "A Novel Non-Contact Capacitive Probe for Common-Mode Voltage Measurement," IEICE Transactions on Communications, Jun. 2007, E90-B(6):1329-1337.
(Continued)

*Primary Examiner* — Thang X Le
(74) *Attorney, Agent, or Firm* — Fish & Richardson P.C.

(57) ABSTRACT

To easily measure a voltage to ground of electromagnetic interference waves generated on a cable. A capacitance-to-ground measurement mechanism 10 includes a first electrode 11 and a second electrode 12 positioned at equal altitudes to be opposed to the earth, and a first voltage measurement device 15 to measure a voltage generated in a first resistance 14 connected between the first electrode 11 and the second electrode 12 by an output signal from an oscillation circuit 13. A voltage-to-ground measurement mechanism 30 includes a GND electrode 31 positioned at an altitude equal to that of the first electrode 11 and the second electrode 12 to be opposed to the earth, and a second voltage measurement device 33 to measure a voltage generated in a second resistance 32 connected between the GND electrode 31 and a probe 34 that is brought into contact with a cable core 106 as a measurement target. A computation mechanism 50 includes a computation device 51 to calculate a voltage to ground of electromagnetic interference waves
(Continued)

generated on a cable based on data of respective voltages measured by the capacitance-to-ground measurement mechanism 10 and the voltage-to-ground measurement mechanism 30.

2 Claims, 9 Drawing Sheets

(51) Int. Cl.
*G01R 15/04* (2006.01)
*G01R 15/16* (2006.01)

(56) References Cited

U.S. PATENT DOCUMENTS

2010/0283539 A1\* 11/2010 Yanagisawa ....... G01R 19/2503
330/127
2021/0239739 A1\* 8/2021 Arai ................... G01R 19/0084

OTHER PUBLICATIONS tek.com, "Probing Techniques for Accurate Voltage Measurements on Power Converters with Oscilloscopes," Tektronix Application Note, retrieved on Jan. 7, 2019, retrieved from URL <https://www.tek.com/document/application-note/probing-techniques-accurate-voltage-measurements-power-supplies-oscillosco>, 16 pages.

\* cited by examiner

CAPACITIVE VOLTAGE MEASUREMENT DEVICE

CROSS-REFERENCE TO RELATED APPLICATIONS

This application is a National Stage application under 35 U.S.C. § 371 of International Application No. PCT/JP2019/051052, having an International Filing Date of Dec. 26, 2019, which claims priority to Japanese Application Serial No. 2019-004064, filed on Jan. 15, 2019. The disclosure of the prior application is considered part of the disclosure of this application, and is incorporated in its entirety into this application.

TECHNICAL FIELD

The present invention relates to a technique for measuring a voltage to ground of electromagnetic interference waves generated on a cable.

BACKGROUND ART

Electromagnetic interference waves are generated from a switching circuit or other devices in a power-supply device. The electromagnetic interference waves propagate through a cable such as a communication line and a power line, and enter a communication device and an electronic device. For example, if the electromagnetic interference waves damage the communication device, this causes a fault such as frame loss or communication disconnection.

In a case where electromagnetic interference waves propagate on a cable, the return path of the electromagnetic interference waves is often the earth or a conductor whose area is so large as to be considered as the earth. Thus, for the purpose of determining whether the fault is caused by the electromagnetic interference waves, and for the purpose of finding a device generating the electromagnetic interference waves, it is necessary to measure a voltage to ground of the electromagnetic interference waves.

In general, as disclosed in non-Patent Literature 1, a measurement device such as an oscilloscope is grounded, and a passive probe is brought into contact with a desired measurement point to measure the voltage to ground. Other than that, as disclosed in non-Patent Literature 2, a non-contact capacitive voltage probe with its outer conductor grounded measures the voltage to ground by clamping the cable.

FIG. 9 is a schematic diagram illustrating an example of the measurement of a voltage to ground using an oscilloscope 101 and a passive probe 102. In this example, a cable 105 connected between a first device 103 and a second device 104 is defined as a measurement target. The passive probe 102 is brought into contact with a cable core 106. The oscilloscope 101 that is grounded to an earth 108 through a floor surface 107 measures a voltage to ground of electromagnetic interference waves generated on the cable 105. Note that grounding is actually established through a grounding electrode or the like of the power supply in the oscilloscope 101.

Conventionally, in the manner as described above, a measurement device or a probe is grounded to set the reference potential to measure a voltage to ground of electromagnetic interference waves generated on a cable.

CITATION LIST

Non-Patent Literature

Non-Patent Literature 1: "Probing Techniques for Accurate Voltage Measurements on Power Converters with Oscilloscope," Tektronix, [online], [referenced on Jan. 7, 2019], the Internet<URL: https://www.tek.com/document/application-note/probing-techniques-accurate-voltage-measurements-power-supplies-oscillosco>

Non-Patent Literature 2: Ryuichi Kobayashi. et al. "A Novel Non-contact Capacitive Probe for Common-Mode Voltage Measurement," IEICE TRANS. COMMUN., Vol. E90-B, No. 6, June 2007, p. 1329-p. 1337

SUMMARY OF THE INVENTION

Technical Problem

However, when a voltage to ground of electromagnetic interference waves is measured, a probe or a measurement device needs to be grounded. Thus, there is a problem in that a worker is burdened with the task of grounding. In environments where grounding cannot be established, the reference potential of the measurement device is unclear. Although assuming that the probe is brought into contact with the cable as a measurement target, the measurement device does not display a measurement result of the voltage to ground. It is thus impossible to accurately measure the voltage to ground itself.

The present invention has been made in view of the above circumstances, and it is an object of the present invention to easily measure a voltage to ground of electromagnetic interference waves generated on a cable.

Means for Solving the Problem

A capacitive voltage measurement apparatus of the present invention is a capacitive voltage measurement apparatus including a capacitance-to-ground measurement mechanism, a voltage-to-ground measurement mechanism, and a computation mechanism, wherein the capacitance-to-ground measurement mechanism includes two electrodes positioned at equal altitudes to be opposed to earth, and a voltage measurement device to measure a voltage generated in a resistor connected between the two electrodes by an output signal from an oscillation circuit, the voltage-to-ground measurement mechanism includes a ground electrode positioned at an altitude equal to that of the two electrodes such that the ground electrode is opposed to the earth, and a voltage measurement device to measure a voltage generated in a resistor connected between the ground electrode and a probe that is brought into contact with a cable as a measurement target, and the computation mechanism includes a computation device to calculate a voltage to ground of electromagnetic interference waves generated on the cable based on data of respective voltages measured by the capacitance-to-ground measurement mechanism and the voltage-to-ground measurement mechanism.

A capacitive voltage measurement apparatus of the present invention is a capacitive voltage measurement apparatus including a capacitance-to-ground measurement mechanism, a voltage-to-ground measurement mechanism, and a computation mechanism, wherein the capacitance-to-ground measurement mechanism includes two lower electrodes positioned at equal altitudes to be opposed to earth, an upper electrode positioned on the two lower electrodes to be opposed to a worker standing on the capacitance-to-ground measurement mechanism, in order that the upper electrode and the worker are capacitively connected, and a voltage measurement device to measure a voltage generated in a resistor by an output signal output from an oscillation circuit to the resistor, the resistor being connected between the two lower electrodes with the upper electrode used as a ground, the voltage-to-ground measurement mechanism includes a lower electrode positioned at an altitude equal to that of the two lower electrodes such that the lower electrode is opposed to the earth, an upper electrode positioned on the lower electrode to be opposed to the worker standing on the voltage-to-ground measurement mechanism, in order that the upper electrode and the worker are capacitively connected, and a voltage measurement device to measure a voltage generated in a resistor connected between the lower electrode and the upper electrode when the worker holds a cable as a measurement target, and the computation mechanism includes a computation device to calculate a voltage to ground of electromagnetic interference waves generated on the cable based on data of respective voltages measured by the capacitance-to-ground measurement mechanism and the voltage-to-ground measurement mechanism.

Effects of the Invention

According to the present invention, a voltage to ground of electromagnetic interference waves generated on a cable can be easily measured.

DESCRIPTION OF EMBODIMENTS

In the present invention, a voltage to ground of electromagnetic interference waves generated on a cable is measured indirectly by estimating a capacitance to ground of the ground of a measurement device. Specifically, the present invention proposes a method, in which a capacitive component between the ground surface of a voltage-to-ground measurement mechanism and the earth surface serving as a return path of the electromagnetic interference waves is obtained indirectly by using a capacitance-to-ground measurement mechanism having two electrodes located at equal altitudes to be opposed to the earth, so that a voltage measured by the voltage-to-ground measurement mechanism, which is not grounded, is calibrated to an actual voltage to ground. With this method, a voltage to ground of the electromagnetic interference waves can be measured without grounding the measurement device. This makes it possible to easily measure a voltage to ground of electromagnetic interference waves generated on a cable.

In a first embodiment, the method for indirectly obtaining a capacitive component with the earth surface is conducted by using a capacitance-to-ground measurement mechanism including two electrodes located to be opposed to the earth. In a second embodiment, the method for indirectly obtaining the capacitive component is conducted by using a capacitance-to-ground measurement mechanism including two lower electrodes located to be opposed to the earth, and one upper electrode located to be opposed to a worker. Hereinafter, two embodiments, the first and second embodiments, will be described in detail.

First Embodiment

Figure 1:
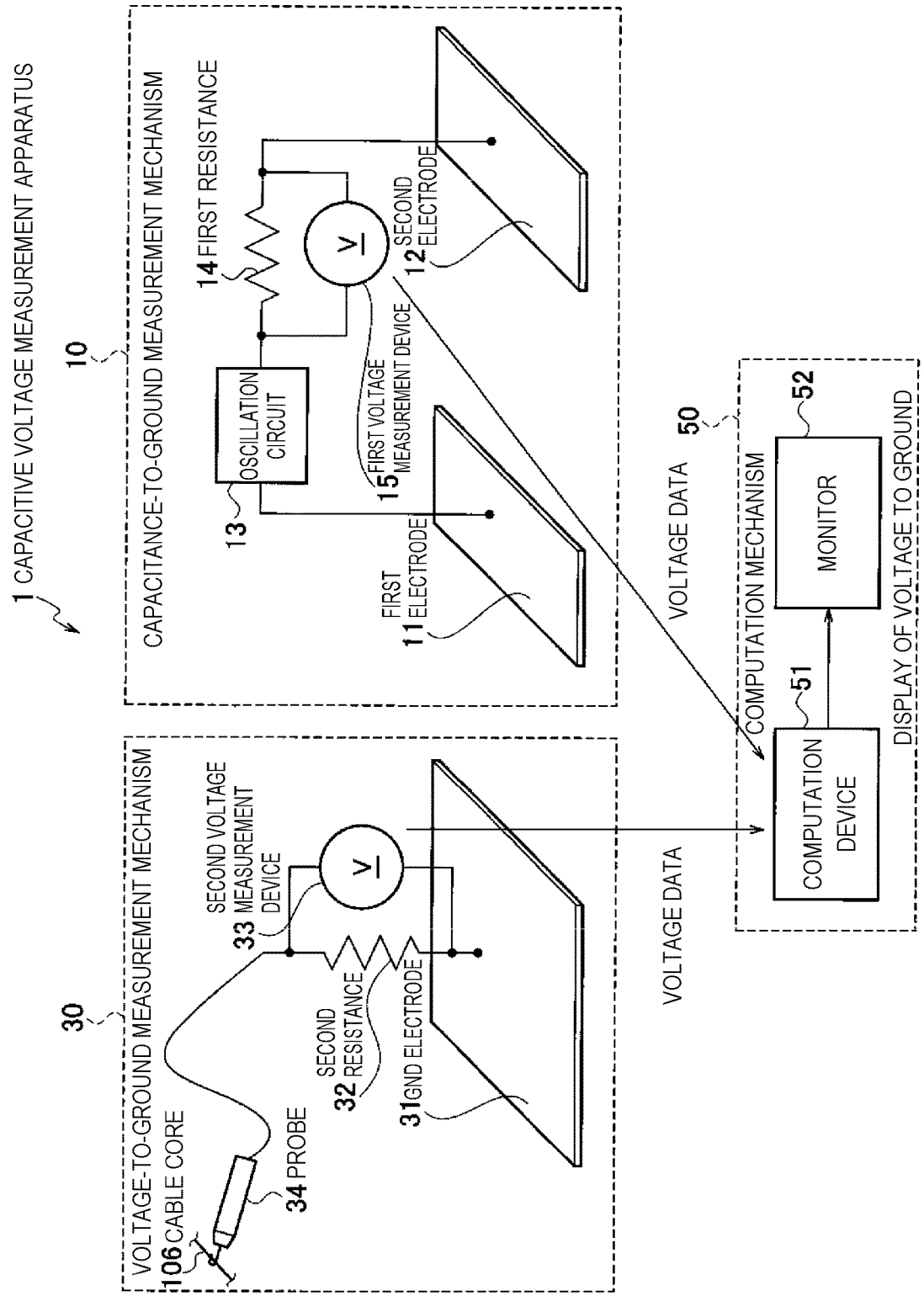
FIG. 1 is a schematic diagram of a capacitive voltage measurement apparatus according to a first embodiment.

FIG. 1 is a schematic diagram of a capacitive voltage measurement apparatus 1 according to the first embodiment. The capacitive voltage measurement apparatus 1 is constituted by including a capacitance-to-ground measurement mechanism 10, a voltage-to-ground measurement mechanism 30, and a computation mechanism 50.

The capacitance-to-ground measurement mechanism 10 is constituted by mainly including a first electrode 11, a second electrode 12, an oscillation circuit 13, a first resistance 14, and a first voltage measurement device 15. The first electrode 11 and the second electrode 12 are positioned at equal altitudes to be opposed to the earth. With this positioning, the earth and the first electrode 11 are capacitively connected, while the earth and the second electrode 12 are capacitively connected. The oscillation circuit 13 and the first resistance 14 are connected in series between the first electrode 11 and the second electrode 12.

In the capacitance-to-ground measurement mechanism 10, the first voltage measurement device 15 measures a voltage generated in the first resistance 14 by a sinusoidal signal output from the oscillation circuit 13, and then transmits voltage data of the measured voltage to the computation device 51 in the computation mechanism 50. The voltage data is transmitted by using a wired or wireless communication network.

The voltage-to-ground measurement mechanism 30 is constituted by mainly including a GND electrode 31, a second resistance 32, a second voltage measurement device 33, and a probe 34 that is brought into contact with a cable core 106 of a cable 105 as a measurement target. The GND electrode 31 is positioned at an altitude equal to that of the first electrode 11 and the second electrode 12 in the capacitance-to-ground measurement mechanism 10 such that the GND electrode 31 is opposed to the earth. With this positioning, the earth and the GND electrode 31 are capacitively connected. The second resistance 32 is connected between the GND electrode 31 and the probe 34.

In the voltage-to-ground measurement mechanism 30, the second voltage measurement device 33 measures a voltage generated in the second resistance 32 by bringing the probe 34 into contact with the cable core 106, and then transmits voltage data of the measured voltage to the computation device 51 in the computation mechanism 50. The voltage data is transmitted by using a wired or wireless communication network. Note that it is allowable to use a capacitive voltage probe as the probe 34, in which the probe 34 is not brought into contact with the cable core 106.

The computation mechanism 50 is constituted by mainly including the computation device 51 and a monitor 52. The computation device 51 calculates a voltage to ground of electromagnetic interference waves generated on a cable with the cable core 106 as a measurement target based on voltage data received individually from the capacitance-to-ground measurement mechanism 10 and the voltage-to-ground measurement mechanism 30. The computation device 51 displays a value of the calculated voltage to ground on the monitor 52.

Next, a calculation method of a voltage to ground is described in detail.

Figure 2:
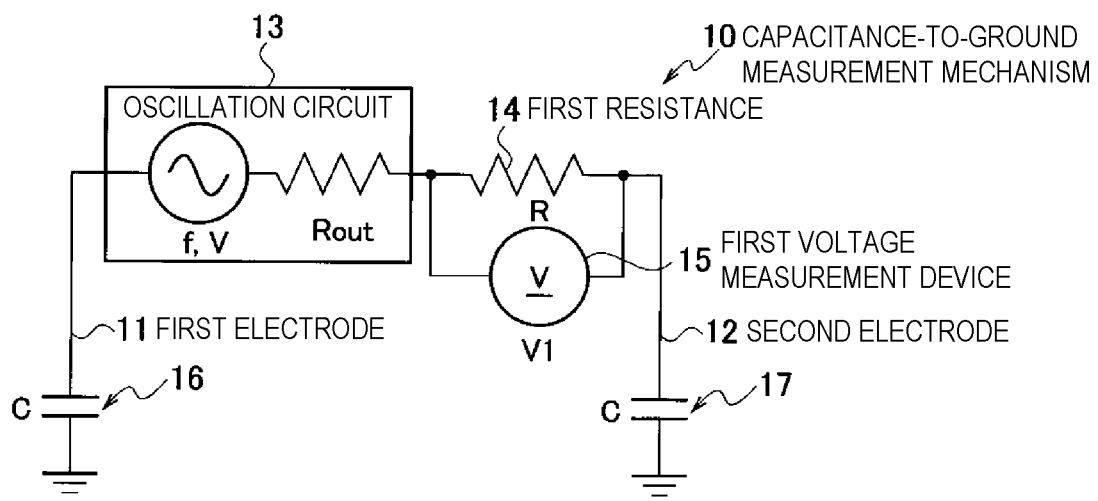
FIG. 2 is a circuit diagram of a capacitance-to-ground measurement mechanism.
Figure 3:
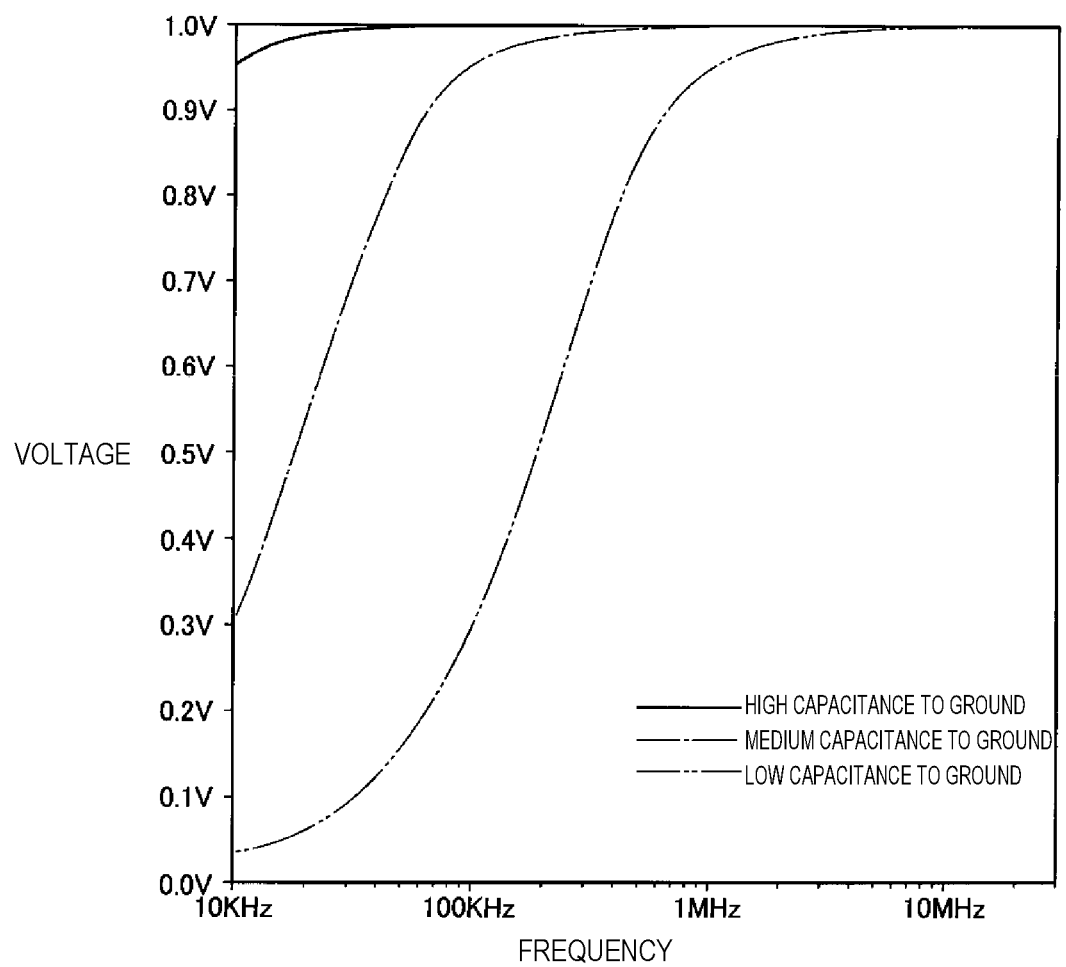
FIG. 3 illustrates an example of circuit analyzation result obtained by analyzing a change in voltage generated in a first resistance.

FIG. 2 is a circuit diagram of the capacitance-to-ground measurement mechanism 10. When a sinusoidal signal with a known voltage and frequency is output from the oscillation circuit 13, a voltage generated in the first resistance 14 is changed depending on a capacitance to ground 16 of the first electrode 11 and a capacitance to ground 17 of the second electrode 12. FIG. 3 illustrates an example of circuit analyzation result obtained by analyzing a change in voltage generated in the first resistance 14. As illustrated in FIG. 3, the voltage generated in the first resistance 14 shows a tendency to increase as the first electrode 11 and the second electrode 12 are closer to the earth (as the capacitance to ground increases).

It is supposed that the area of the first electrode 11 is equal to the area of the second electrode 12. As illustrated in FIG. 2, the capacitance to ground 16 and the capacitance to ground 17 are defined as a capacitance to ground C, and the first resistance 14 is defined as a resistance R. It is also supposed that a sinusoidal signal with a frequency f and a voltage V is output with an output impedance Rout from the oscillation circuit 13. In this case, where a voltage generated in the first resistance 14 is defined as V1, V1 is represented as Expression (1).

[Math. 1]

$$V1 = \frac{R}{\frac{1}{j\pi fC} + Rout + R} V \quad \text{Expression (1)}$$

Values of all the variables, except the capacitance to ground C, can be determined by a designer. Thus, the capacitance to ground C of the first electrode 11 and the capacitance to ground C of the second electrode 12 can be calculated by measuring V1. This calculation is performed by the computation device 51.

In contrast, a capacitance to ground of the GND electrode 31 in the voltage-to-ground measurement mechanism 30 is defined as Cg, although the capacitance to ground Cg is not illustrated in the diagrams. The capacitance to ground Cg can be calculated in the computation device 51 by using the area ratio between the first electrode 11 and the GND electrode 31 or between the second electrode 12 and the GND electrode 31. For example, Cg=aC is satisfied where the area ratio is 1:a between the GND electrode 31 in the voltage-to-ground measurement mechanism 30 and the first electrode 11 or between the GND electrode 31 and the second electrode 12.

When the capacitance to ground Cg between the earth and the GND electrode 31 in the voltage-to-ground measurement mechanism 30 is found, then a voltage to ground of electromagnetic interference waves generated on a cable as a measurement target, with which the probe 34 is brought into contact, can be calculated based on a voltage generated in the second resistance 32 in the voltage-to-ground measurement mechanism 30.

Where the voltage to ground generated on the cable is defined as Vc, a voltage generated in the second resistance 32 is defined as V2, the second resistance 32 is defined as R2, and an impedance of the probe 34 is defined as Zp, then an expression to obtain the voltage to ground Vc based on the capacitance to ground Cg between the earth and the GND electrode 31 in the voltage-to-ground measurement mechanism 30 is represented as Expression (2). Note that ω represents an angular frequency of the voltage to ground Vc generated on a cable as a measurement target.

[Math. 2]

$$Vc = \frac{\frac{1}{j\omega Cg} + R2 + Zp}{R2} V2 \quad \text{Expression (2)}$$

This calculation is performed by the computation device 51. A calculation result of the voltage to ground generated on the cable, which is calculated by the computation device 51, is displayed on the monitor 52 to inform a worker of the calculation result.

Figure 4:
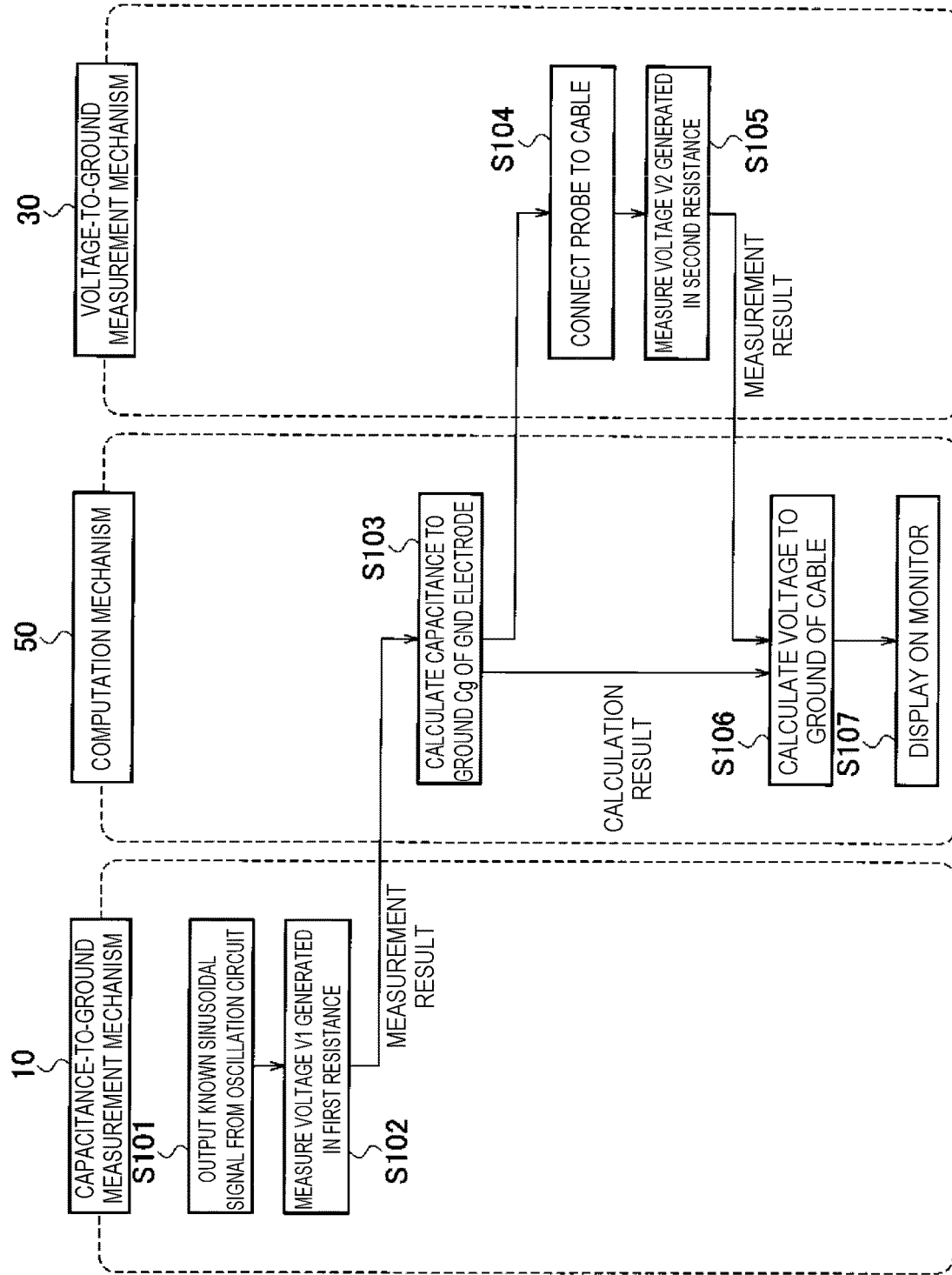
FIG. 4 illustrates a flowchart of a calculation method of a voltage to ground according to the first embodiment.

Next, a calculation method of a voltage to ground is described with reference to a processing flow. FIG. 4 illustrates a flowchart of the calculation method of the voltage to ground according to the first embodiment.

Steps S101 and S102;

First, in the capacitance-to-ground measurement mechanism 10, a sinusoidal signal with a frequency f and a voltage V is output from the oscillation circuit 13, and the first voltage measurement device 15 measures the voltage V1 generated in the first resistance 14, and then transmits voltage data of the measured voltage V1 to the computation mechanism 50.

Step S103;

Next, in the computation mechanism 50, the computation device 51 calculates the capacitance to ground C of the first electrode 11 (=the capacitance to ground C of the second electrode 12) by substituting the voltage V1 transmitted from the capacitance-to-ground measurement mechanism 10, the resistance R of the first resistance 14 determined by a designer, the frequency f and the voltage V of the sinusoidal signal, and the output impedance Rout of the sinusoidal signal into Expression (1). The computation mechanism 50 then calculates the capacitance to ground Cg of the GND electrode 31 based on the area ratio between the GND electrode 31 in the voltage-to-ground measurement mechanism 30 and the first electrode 11 (or the second electrode 12). As described above, Cg=aC is satisfied where the area ratio is 1:a between the GND electrode 31 in the voltage-to-ground measurement mechanism 30 and the first electrode 11 (or the second electrode 12).

Steps S104 and S105;

In contrast, in the voltage-to-ground measurement mechanism 30, the second voltage measurement device 33 measures the voltage V2 generated in the second resistance 32 at a timing when the probe 34 is connected to a cable as a measurement target by a worker, and then transmits voltage data of the measured voltage V2 to the computation mechanism 50.

Steps S106 and S107;

Thereafter, in the computation mechanism 50, the computation device 51 calculates the voltage to ground Vc of electromagnetic interference waves generated on the cable as a measurement target by substituting the capacitance to ground Cg of the GND electrode 31 calculated in step S103, the voltage V2 transmitted from the voltage-to-ground measurement mechanism 30 in step S105, the resistance R2 of the second resistance 32 determined by a designer, and an impedance Zp of the probe 34 into Expression (2). Thereafter, the computation mechanism 50 displays the calculated voltage to ground Vc on the monitor 52.

Second Embodiment

Figure 5:
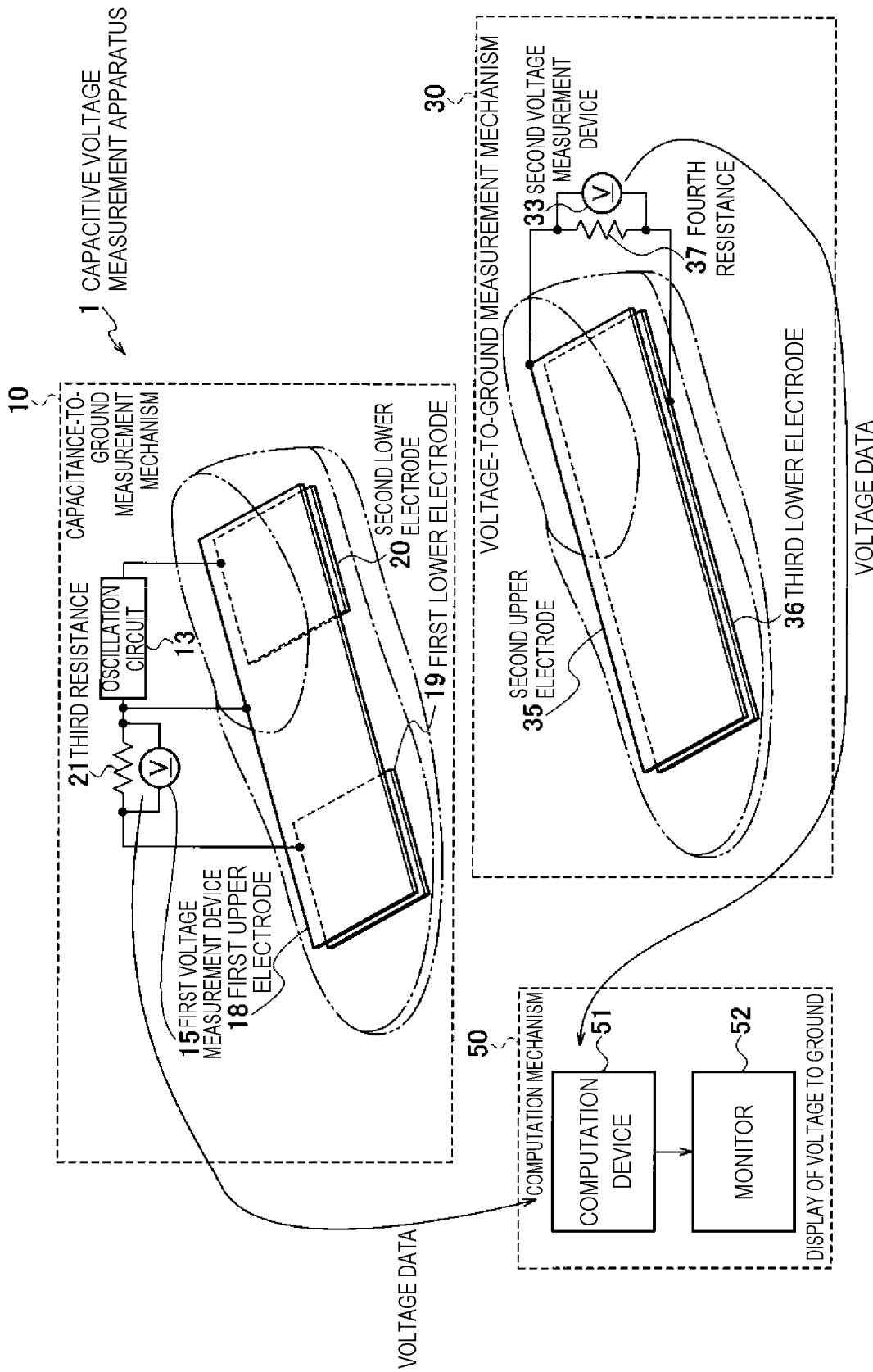
FIG. 5 is a schematic diagram of a capacitive voltage measurement apparatus according to a second embodiment.
Figure 6:
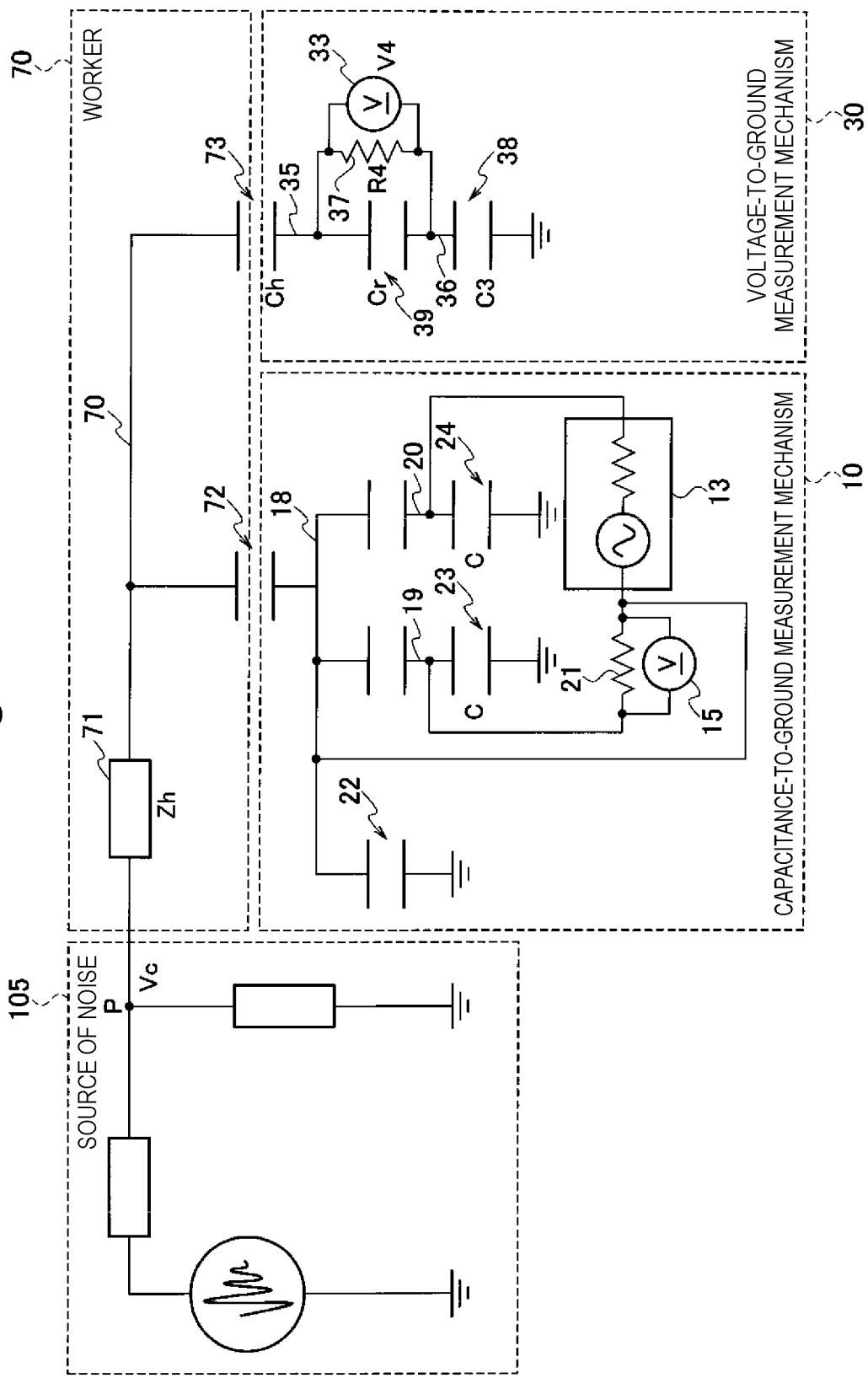
FIG. 6 is a circuit diagram illustrating the entire measurement condition including a worker and a cable as a measurement target.

A second embodiment is intended to improve worker's convenience in measurement compared to the first embodiment. FIG. 5 is a schematic diagram of the capacitive voltage measurement apparatus 1 according to the second embodiment. FIG. 6 is a circuit diagram illustrating the entire measurement condition including a worker 70 and the cable 105 (source of noise) as a measurement target. In the second embodiment, the basic configuration of the capacitive voltage measurement apparatus 1 is identical to that according to the first embodiment, in which the capacitive voltage measurement apparatus 1 is constituted by including the capacitance-to-ground measurement mechanism 10, the voltage-to-ground measurement mechanism 30, and the computation mechanism 50.

The capacitance-to-ground measurement mechanism 10 and the voltage-to-ground measurement mechanism 30 are used assuming that a worker stands on the capacitance-to-ground measurement mechanism 10 and the voltage-to-ground measurement mechanism 30 that are, for example, implemented in the form of a pair of shoes and positioned inside the shoe sole. In the second embodiment, a worker does not bring a probe into contact with the cable 105 as a measurement target, but holds the cable 105 from above the sheath by hand to measure a voltage to ground. Note that it is allowable that the computation mechanism 50 may be integrated with, or may be separated from, either the capacitance-to-ground measurement mechanism 10 or the voltage-to-ground measurement mechanism 30.

The capacitance-to-ground measurement mechanism 10 is constituted by mainly including a first upper electrode 18, a first lower electrode 19, a second lower electrode 20, a third resistance 21, the oscillation circuit 13, and the first voltage measurement device 15. In the same manner as in the first embodiment 1, the first lower electrode 19 and the second lower electrode 20 are positioned at equal altitudes to be opposed to the earth.

When the worker 70 holds the cable 105 that is desired for the worker 70 to measure the voltage to ground, the worker 70 is connected with the cable 105 through a constant impedance 71 as illustrated in FIG. 6. When the worker 70 him/herself is regarded as a node, the worker 70 and the first upper electrode 18 are capacitively connected (a capacitance 72 in FIG. 6), while the worker 70 and a second upper electrode 35 are capacitively connected (a capacitance 73 in FIG. 6).

In the capacitance-to-ground measurement mechanism 10, an output terminal of the oscillation circuit 13 is connected to the second lower electrode 20, while a GND terminal of the oscillation circuit 13 is connected to the first upper electrode 18. The GND terminal of the oscillation circuit 13 is connected to one terminal of the third resistance 21, while the other terminal of the third resistance 21 is connected to the first lower electrode 19.

In the capacitance-to-ground measurement mechanism 10, the first voltage measurement device 15 measures a voltage generated in the third resistance 21 by a sinusoidal signal output from the oscillation circuit 13, and then transmits voltage data of the measured voltage to the computation device 51 in the computation mechanism 50. The voltage data is transmitted by using a wireless communication network when the computation mechanism 50 is not integrated with the capacitance-to-ground measurement mechanism 10. The voltage data is transmitted by using a wired or wireless communication network when the computation mechanism 50 is integrated with the capacitance-to-ground measurement mechanism 10.

The voltage-to-ground measurement mechanism 30 is constituted by mainly including the second upper electrode 35, a third lower electrode 36, a fourth resistance 37, and the second voltage measurement device 33. In the same manner as in the first embodiment, the third lower electrode 36 is positioned at an altitude equal to that of the first lower electrode 19 and the second lower electrode 20 in the capacitance-to-ground measurement mechanism 10 such that the third lower electrode 36 is opposed to the earth.

In the voltage-to-ground measurement mechanism 30, the second voltage measurement device 33 measures a voltage generated in the fourth resistance 37 when the worker 70 holds the cable 105, and then transmits voltage data of the measured voltage to the computation device 51 in the computation mechanism 50. The voltage data is transmitted by using a wireless communication network when the computation mechanism 50 is not integrated with the voltage-to-ground measurement mechanism 30. The voltage data is transmitted by using a wired or wireless communication network when the computation mechanism 50 is integrated with the voltage-to-ground measurement mechanism 30.

The computation mechanism 50 is constituted by mainly including the computation device 51 and the monitor 52. The computation device 51 calculates a voltage to ground (a voltage at a point P in FIG. 6) of electromagnetic interference waves generated on the cable 105 as a measurement target based on voltage data received individually from the capacitance-to-ground measurement mechanism 10 and the voltage-to-ground measurement mechanism 30. The computation device 51 displays a value of the calculated voltage to ground on the monitor 52.

Next, a calculation method of a voltage to ground is described in detail.

Figure 7:
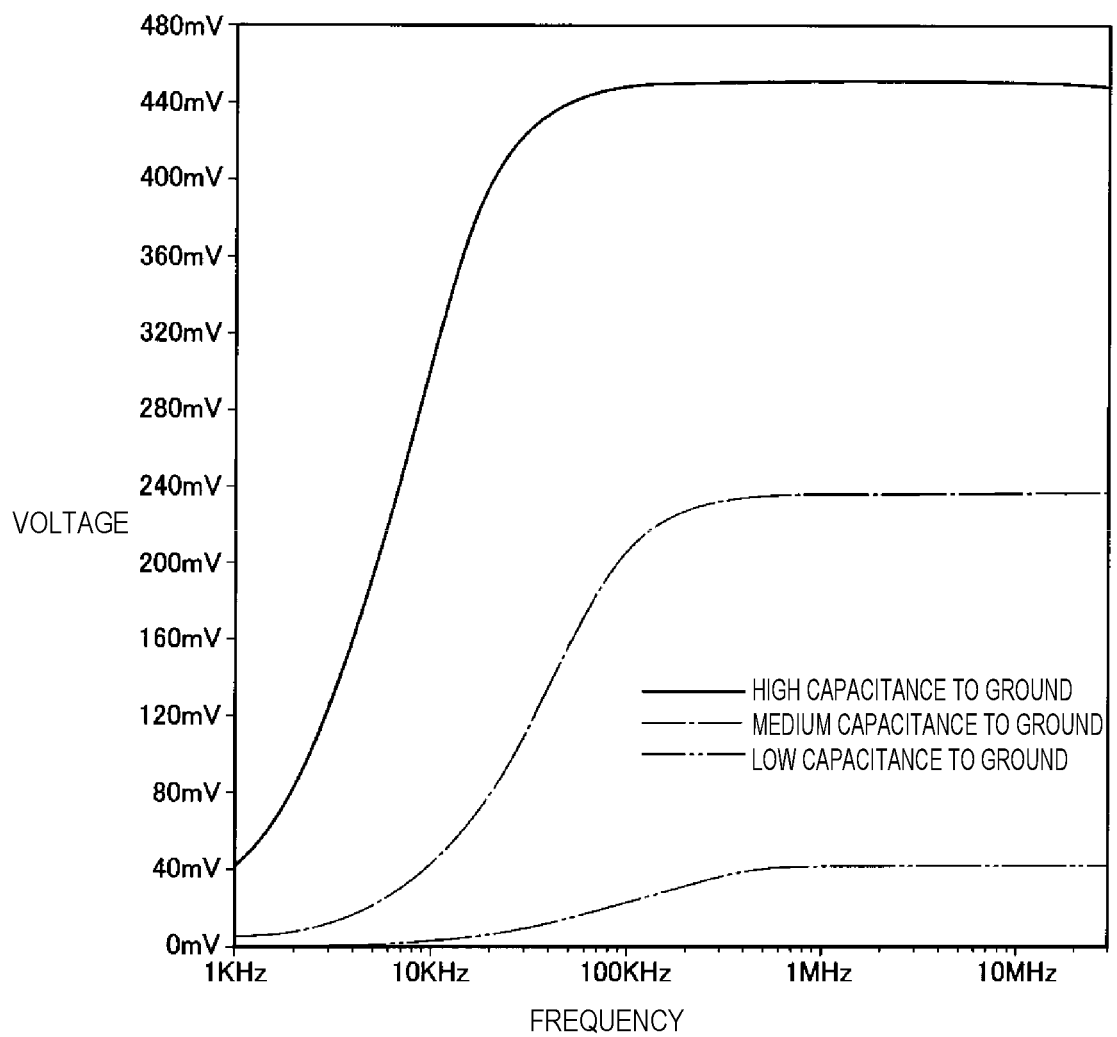
FIG. 7 illustrates an example of circuit analyzation result obtained by analyzing a change in voltage generated in a third resistance.

In the capacitance-to-ground measurement mechanism 10, when a sinusoidal signal with a known voltage and frequency is output from the oscillation circuit 13, a voltage generated in the third resistance 21 is changed depending on a capacitance to ground 22 of the first upper electrode 18, a capacitance to ground 23 of the first lower electrode 19, and a capacitance to ground 24 of the second lower electrode 20. FIG. 7 illustrates an example of circuit analyzation result obtained by analyzing a change in voltage generated in the third resistance 21. As illustrated in FIG. 7, the voltage generated in the third resistance 21 shows a tendency to increase as the first lower electrode 19, the second lower electrode 20, and the first upper electrode 18 are closer to the earth (as the capacitance to ground increases).

The voltage generated in the third resistance 21 is uniquely determined by altitudes of the first lower electrode 19, the second lower electrode 20, and the first upper electrode 18 from the earth. Similarly to the first embodiment, the capacitance to ground 23 of the first lower electrode 19, and the capacitance to ground 24 of the second lower electrode 20 have a proportional relationship with a capacitance to ground 38 of the third lower electrode 36 in the voltage-to-ground measurement mechanism 30. Thus, the computation device 51 can indirectly calculate the capacitance to ground 38 (C3) of the third lower electrode 36 based on the voltage generated in the third resistance 21.

The voltage to ground Vc at a desired measurement point P is divided by the impedance 71 (Zh) at a portion of the cable 105 held by the worker 70, the capacitance 73 (Ch) between the worker 70 and the second upper electrode 35 in the voltage-to-ground measurement mechanism 30, a parallel circuit made up of the fourth resistance 37 (R4) and a capacitance 39 (Cr) between the second upper electrode 35 and the third lower electrode 36, and the capacitance to ground 38 (C3) of the third lower electrode 36.

Among these values, a value of the impedance 71 (Zh) at a portion of the cable held by the worker 70 is determined by the thickness of the cable held by the worker 70, the thickness of the sheath, and other factors. Values of the capacitance 73 (Ch) between the worker 70 and the second upper electrode 35, the capacitance 39 (Cr) between the second upper electrode 35 and the third lower electrode 36, and the fourth resistance 37 (R4) can be determined by a designer. A value of the capacitance to ground 38 of the third lower electrode 36 can be calculated by the computation device 51 based on a measurement result obtained by the capacitance-to-ground measurement mechanism 10. Thus, a voltage (V4), generated in the fourth resistance 37 when the worker 70 holds the cable 105, is transmitted to the computation device 51, and then the computation device 51 can calculate the voltage to ground Vc that is desired to be measured.

An expression to obtain the voltage to ground Vc at the desired measurement point P based on the voltage V4 generated in the fourth resistance 37, the resistance R4 of the fourth resistance 37, the impedance Zh at a portion of the cable 105 held by the worker 70, the capacitance Ch between the worker 70 and the second upper electrode 35, the capacitance Cr between the second upper electrode 35 and the third lower electrode 36, and the capacitance to ground C3 of the third lower electrode 36 is represented as Expression (3). Note that ω represents an angular frequency of the voltage to ground Vc generated on the cable 105 as a measurement target.

[Math. 3]

$$Vc = \left(\frac{1}{R4} + j\omega Cr\right)\left(Zh + \frac{1}{j\omega Ch} + \frac{1}{j\omega C3} + \frac{1}{\left(\frac{1}{R4} + j\omega Cr\right)}\right)V4 \quad \text{Expression (3)}$$

This calculation is performed by the computation device 51. A calculation result of the voltage to ground generated on the cable 105, which is calculated by the computation device 51, is displayed on the monitor 52 to inform a worker of the calculation result.

Figure 8:
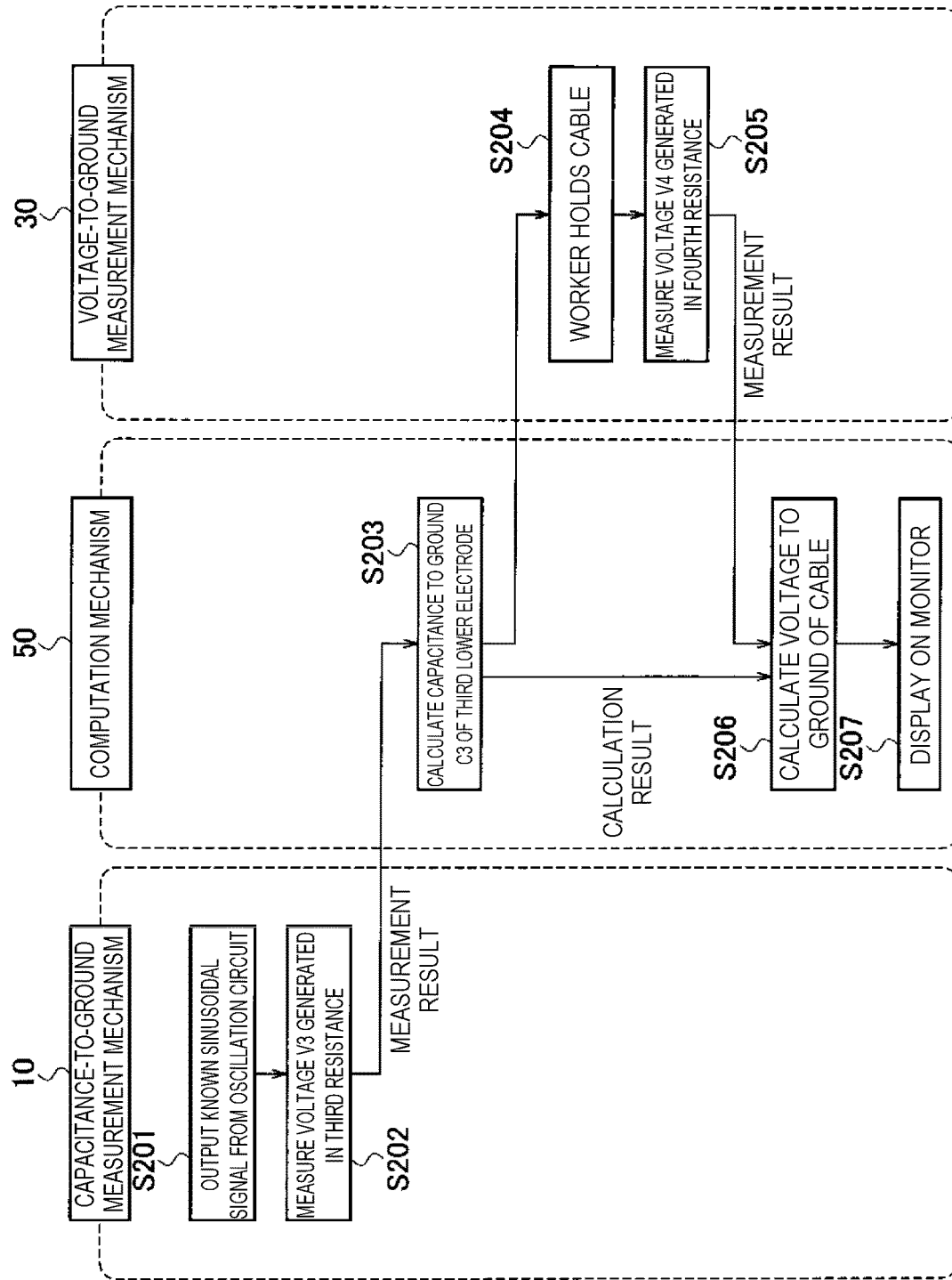
FIG. 8 illustrates a flowchart of a calculation method of a voltage to ground according to the second embodiment.
Figure 9:
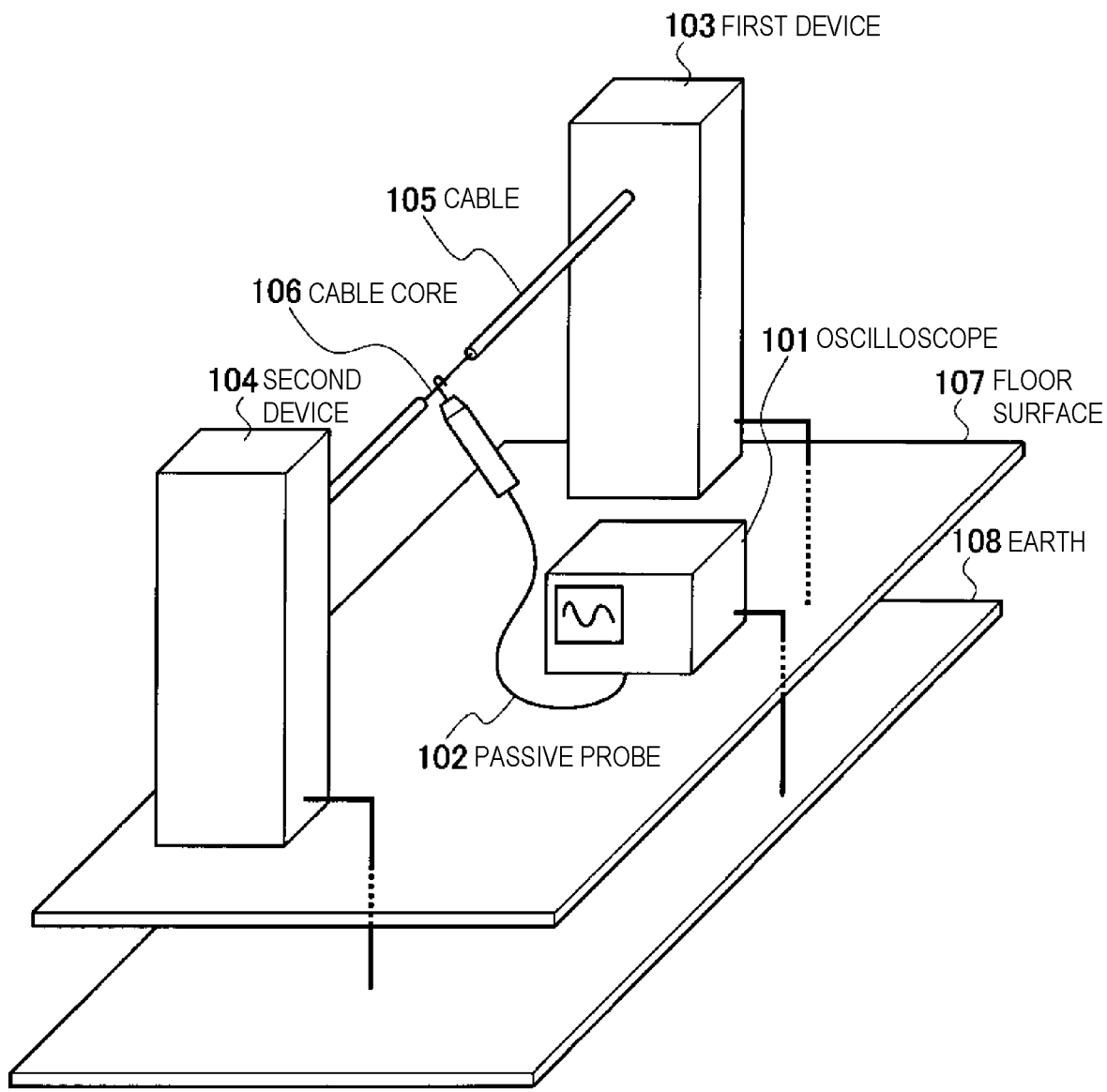
FIG. 9 is a schematic diagram illustrating a conventional measurement method of a voltage to ground.

Next, a calculation method of a voltage to ground is described with reference to a processing flow. FIG. 8 illustrates a flowchart of the calculation method of the voltage to ground according to the second embodiment.

Steps S201 and S202;

In the capacitance-to-ground measurement mechanism 10, a sinusoidal signal with a frequency f and a voltage V is output from the oscillation circuit 13, and the first voltage measurement device 15 measures the voltage V3 generated in the third resistance 21, and then transmits voltage data of the measured voltage V3 to the computation mechanism 50.

Step S203;

Next, in the computation mechanism 50, the computation device 51 calculates the capacitance to ground 23 (C) of the first lower electrode 19 (=the capacitance to ground 24 (C) of the second lower electrode 20) by using the voltage V3 transmitted from the capacitance-to-ground measurement mechanism 10, the resistance R of the third resistance 21 determined by a designer, the frequency f and the voltage V of the sinusoidal signal, and the output impedance Rout of the sinusoidal signal. The computation mechanism 50 then calculates the capacitance to ground 38 (C3) of the third lower electrode 36 based on a given proportional relationship between the capacitance to ground 23 of the first lower electrode 19 (or the capacitance to ground 24 of the second lower electrode 20) and the capacitance to ground 38 of the third lower electrode 36.

Steps S204 and S205;

In contrast, in the voltage-to-ground measurement mechanism 30, the second voltage measurement device 33 measures the voltage V4 generated in the fourth resistance 37 at a timing when the worker 70 holds the cable 105, and then transmits voltage data of the measured voltage V4 to the computation mechanism 50.

Steps S206 and S207;

Thereafter, in the computation mechanism 50, the computation device 51 calculates the voltage to ground Vc of electromagnetic interference waves generated on a cable as a measurement target by substituting the capacitance to ground C3 of the third lower electrode 36 calculated in step S203, the voltage V4 transmitted from the voltage-to-ground measurement mechanism 30 in step S205, the resistance R4 of the fourth resistance 37, the impedance Zh at a portion of the cable 105 held by the worker 70, the capacitance Ch between the worker 70 and the second upper electrode 35, and the capacitance Cr between the second upper electrode 35 and the third lower electrode 36 into Expression (3). Thereafter, the computation mechanism 50 displays the calculated voltage to ground Vc on the monitor 52.

Effects of First and Second Embodiments

As described above, in the first embodiment, the computation mechanism 50 obtains a capacitance to ground of the GND electrode 31 in the voltage-to-ground measurement mechanism 30 by using a voltage generated in the first resistance 14 in the capacitance-to-ground measurement mechanism 10. Using a value of the obtained capacitance to ground, the computation mechanism 50 converts a voltage, generated in the second resistance 32 in the voltage-to-ground measurement mechanism when the probe 34 is brought into contact with the cable 105, to a voltage to ground of the cable 105.

In the second embodiment, the capacitance-to-ground measurement mechanism 10 and the voltage-to-ground measurement mechanism 30 are implemented in the form of shoes such that a worker can wear. In addition to that, by using a voltage generated in the third resistance 21 in the capacitance-to-ground measurement mechanism 10, the computation mechanism 50 obtains a capacitance to ground of the third lower electrode 36 in the voltage-to-ground measurement mechanism 30. Using a value of the obtained capacitance to ground, the computation mechanism 50 converts a voltage, generated in the fourth resistance 37 in the voltage-to-ground measurement mechanism 30 when a worker holds the cable 105, to a voltage to ground of the cable 105.

That is, according to the first and second embodiments, the capacitance-to-ground measurement mechanism 10 estimates a capacitance to ground on a GND surface of the voltage-to-ground measurement mechanism 30 that is a measurement device, and uses the estimated capacitance to ground to indirectly measure a voltage to ground of electromagnetic interference waves generated on a cable. Therefore, a voltage to ground can be measured without establishing a ground in the voltage-to-ground measurement mechanism 30. This makes it possible to easily measure a voltage to ground of electromagnetic interference waves generated on a cable.

REFERENCE SIGNS LIST

1 Capacitive voltage measurement apparatus
10 Capacitance-to-ground measurement mechanism
11 First electrode
12 Second electrode
13 Oscillation circuit
14 First resistance
16, 17 Capacitance to ground
18 First upper electrode
19 First lower electrode
20 Second lower electrode
21 Third resistance
22-24 Capacitance to ground
30 Voltage-to-ground measurement mechanism
31 GND electrode
32 Second resistance
33 Second voltage measurement device
34 Probe
35 Second upper electrode
36 Third lower electrode
37 Fourth resistance
38 Capacitance to ground
39 Capacitance
50 Computation mechanism
51 Computation device
52 Monitor
70 Worker
71 Impedance
72, 73 Capacitance
101 Oscilloscope
102 Passive probe
103 First device
104 Second device
105 Cable
106 Cable core
107 Floor surface
108 Earth

The invention claimed is:

1. A capacitive voltage measurement apparatus comprising a capacitance-to-ground measurement mechanism, a voltage-to-ground measurement mechanism, and a computation mechanism, wherein
the capacitance-to-ground measurement mechanism comprises:
two electrodes positioned at equal altitudes to be opposed to earth, and
a voltage measurement device to measure a voltage generated in a resistor connected between the two electrodes by an output signal from an oscillation circuit,
the voltage-to-ground measurement mechanism comprises:
a ground electrode positioned at an altitude equal to that of the two electrodes such that the ground electrode is opposed to the earth, and
a voltage measurement device configured to measure a voltage generated in a resistor connected between the ground electrode and a probe that is brought into contact with a cable as a measurement target, and
the computation mechanism comprises:
a computation device to calculate a voltage to ground of electromagnetic interference waves generated on the cable based on data of respective voltages measured by the capacitance-to-ground measurement mechanism and the voltage-to-ground measurement mechanism.

2. A capacitive voltage measurement apparatus comprising a capacitance-to-ground measurement mechanism, a voltage-to-ground measurement mechanism, and a computation mechanism, wherein
the capacitance-to-ground measurement mechanism comprises:
two lower electrodes positioned at equal altitudes to be opposed to earth,
an upper electrode positioned on the two lower electrodes to be opposed to a worker standing on the capacitance-to-ground measurement mechanism, in order that the upper electrode and the worker are capacitively connected, and
a first voltage measurement device to measure a voltage generated in a resistor by an output signal output from an oscillation circuit to the resistor, the resistor being connected between the two lower electrodes with the upper electrode used as a ground,
the voltage-to-ground measurement mechanism comprises
a lower electrode positioned at an altitude equal to that of the two lower electrodes such that the lower electrode is opposed to the earth,
an upper electrode positioned on the lower electrode to be opposed to the worker standing on the voltage-to-ground measurement mechanism, in order that the upper electrode and the worker are capacitively connected, and
a second voltage measurement device to measure a voltage generated in a resistor connected between the lower electrode and the upper electrode when the worker holds a cable as a measurement target, and
the computation mechanism comprises
a computation device to calculate a voltage to ground of electromagnetic interference waves generated on the cable based on data of respective voltages measured by the capacitance-to-ground measurement mechanism and the voltage-to-ground measurement mechanism.

* * * * *